(12) United States Patent
Albon et al.

(10) Patent No.: US 6,198,678 B1
(45) Date of Patent: Mar. 6, 2001

(54) SEMICONDUCTOR MEMORIES

(75) Inventors: Richard Albon, Tavistock; Martin Alan, Plymouth; David Johnston, Tavistock, all of (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/333,561

(22) Filed: Jun. 21, 1999

(30) Foreign Application Priority Data

Jun. 23, 1998 (GB) ................................................... 9813459

(51) Int. Cl.[7] ............................................. G11C 7/00
(52) U.S. Cl. ..................... 365/203; 365/204; 365/185.25
(58) Field of Search ................................... 365/203, 204, 365/185.25

(56) References Cited

U.S. PATENT DOCUMENTS

| 5,420,818 | * | 5/1995 | Svejda et al. | 365/104 |
|---|---|---|---|---|
| 5,519,655 | | 5/1996 | Greenberg | 365/189.02 |
| 5,570,316 | | 10/1996 | Lysinger | 365/196 |
| 5,636,174 | * | 6/1997 | Rao | 365/230.03 |
| 5,703,821 | * | 12/1997 | Barroni et al. | 315/210 |
| 5,745,421 | * | 4/1998 | Pham et al. | 365/203 |
| 5,754,010 | * | 5/1998 | Caravella et al. | 365/203 |

FOREIGN PATENT DOCUMENTS

| 2 256 071 | 11/1992 | (GB) . |
|---|---|---|
| 2256071A | 11/1992 | (GB) . |
| 2 288 046 | 10/1995 | (GB) . |
| 2288046A | 10/1995 | (GB) . |

* cited by examiner

*Primary Examiner*—David Nelms
*Assistant Examiner*—Connie C. Yoha
(74) *Attorney, Agent, or Firm*—Kirschstein, et al.

(57) ABSTRACT

A semiconductor memory, for example of the ROM type, has columns of memory cells with a bitline for each column connected to the cells of the column. The bitlines are connected via multiplexers to the input of a sense amplifier. Before column selection, the bitlines are held uncharged. When a column is selected, its bitline is connected to a charging voltage by a pull up transistor.

4 Claims, 4 Drawing Sheets

SEMICONDUCTOR MEMORIES

BACKGROUND OF THE INVENTION

The present invention relates to semiconductor memories and in particular, although not exclusively, to semiconductor read only memories.

DESCRIPTION OF THE RELATED ART

Traditionally, semiconductor read only memories (ROMs) have been designed for applications either where device density was more important than operating speed, or where operating speed was more important than device density. These two requirements have resulted in two different approaches to the design of ROMs and their sensing arrangements.

Where operating speed is of lesser importance, a digital logic approach to sensing memory core contents has been sufficient. Inherent in large ROMs is the presence of large capacitive loads on both bitlines and wordlines. Such loads require relatively long periods of time to allow slow moving voltage signals to propagate to the Q outputs. It is common for an inverter to be used to boost the bitline or mux output signals for the Q outputs. Where speed is more important, a number of smaller ROMs are generally used. Smaller ROMs are able to operate at higher speeds because bitline and wordline loads are smaller.

A number of approaches have been used to achieve higher operating speeds in larger ROMs. One such approach splits ROMs into smaller blocks of ROM which are connected in parallel. This approach results in smaller wordlines and bitlines but results in an inefficient device layout, and many circuits in each block of ROM necessarily are duplicated.

A second approach uses special coding techniques in ROM cells to reduce memory core area and internal signal propagation delays. This approach adds complexity to the ROM, which is often considered to be too great a pay off for the benefits achieved. Where ROM area is less critical, a third approach uses dual bit memory cells in the ROM core, to increase signal strength prior to sensing. Here, the bitline pair associated with each memory cell provides complementary signals to the sense amplifier in much the same way as a random access memory (RAM). The increased signal strength, i.e., larger amplitude signals, allows access times to be reduced. The fourth approach uses what can be described as a hybrid of a single and a dual bit memory cell to provide signals to a sense amplifier. In this approach, a reference voltage signal which is of an amplitude half way between a logic one and a logic zero is applied to the second input of the sense amplifier, with the first input being provided by the memory cell.

A conventional ROM according to the above mentioned fourth approach is shown in FIG. 1, in which first to fourth memory cell transistors 11 to 14 are connected each to one of wordlines wl<1> and wl<0> and to one of bitlines bl<0> and bl<15>. These transistors form part of a large array of memory cell transistors, typically 256k or 512k by 16 columns of transistors per bit by 8 bits per word in size, each similarly connected to a bitline and to a wordline. Only the four memory cell transistors 11–14 are shown for simplicity. The transistors 11 and 14 have their third electrode ground connected, whereas the transistors 12 and 13 do not. Dummy transistors 15 and 16 are connected, in a manner similar to the transistors 11–14 connections to the bitlines bl<0> and bl<15>, to a dummy bitline dbl. The bitlines bl<0>, bl<15> and dbl are selectively connected to supply voltage by respective ones of precharge transistors 17, 18 and 19. Bitlines bl<0> and bl<15> are selectively connected to a first sense amplifier input line mbll by respective ones of column decode logic and mux circuits 20 and 21. The column decode logic and mux circuits 20 and 21 provide connection of their respective bitline bl<0> or bl<15> to the line mbll only in the presence of appropriate column select signals on a predecoded address bus line pradc. Only one of the bitlines bl<0> and bl<15> is selected at any one time. The bitline dbl is connected to a second sense amplifier input line mblr by a matching transistor 22. A dummy memory cell transistor 23 is connected between the bitline dbl and ground.

Connected between the lines mbll and mblr are first and second equalization transistors 24 and 25. Clamp transistors 26 and 27 connect respective ones of the lines mbll and mblr to supply voltage in dependence on the voltage present on their respective line mbll or mblr. The transistors 26 and 27 act as weak dc clamps, pulling the lines mbll and mblr to supply voltage when these lines are not driven. Transistors 28, 29, 30 and 31 are connected to form a sense amplifier, in a current mirror configuration. A sense amplifier output is taken from the connection between the sense amplifier transistors 28 and 30.

A typical timing diagram is shown in FIG. 2. A received address is clocked through decode logic (not shown), which identifies a particular row and column, i.e., a particular wordline and bitline, of the memory core. The rising edge of the clock signal enables the precharge transistors 17 to 19 to pre-charge each of the bitlines bl<O>, bl<15> and dbl, and enables the equalization transistors 24 and 25 to equalize the lines mbll and mblr. At some time after this clock signal rising edge, the address decode logic circuit (not shown) applies signals to select appropriate ones of the wordlines and bitlines. Logic circuits (not shown) operate on detection of the wordline wl<1> or wl<0> and bitlines bl<0> or bl<15> having been selected and the bitlines having become charged to supply voltage, to invert the pre-charge and equalization signals applied to the transistors 17 to 19 and 24 and 25.

The ones of the memory cells transistors 11 to 14 which are both enabled by virtue of a signal on their respective wordline and are connected to ground potential will cause discharging of their respective bitline. All other memory cell transistors will not effect any discharge of their respective bitline, except by intrinsic leakage. The switching of the dummy memory cell transistor 23 by the address decode logic (not shown) at the same time as the wordline selection causes discharge of the bitline dbl to ground potential. The dummy memory cell transistor 23 is always selected when any wordline is selected. This discharge occurs at half the rate of any other bitline which is being discharged. As the bitline bl<0> or bl<15> is connected to the line mbll through its respective column decode and mux logic circuit 20 or 21 and the dummy bitline dbl is connected to the line mblr through the transistor 22, a divergence of the voltages on respective ones of the lines mbll and mblr will occur. This divergence is detected and amplified by the sense amplifier formed by transistors 28 to 31. The sense amplifier thus provides a sense output signal which is indicative of the sense of the voltage signal on the line mbll compared to that of the voltage signal on the line mblr, which is thus representative of the state of the selected memory cell transistor 11 to 14.

The sense output signal of the sense amplifier is propagated to and then buffered by a buffer (not shown) before being passed as the Q output. The buffer (not shown) introduces a slight delay.

In this ROM, non selected bitlines which are associated with a ground connected memory cell transistor in the selected row, even though they are not selected bitlines, will be discharged to ground.

The fact that each of the bitlines bl<0>, bl<15> and dbl are pre-charged before each read operation and around half of them are discharged at the end of each operation (assuming 50% ones and 50% zeros in any given row of a memory core) means that the FIG. 1 ROM has quite high current consumption. Leakage of charge from the bitlines through the p-n leakage and sub-leakage effects intrinsic in memory cell transistors increases further the current consumption. Also, continual charging and discharging in this way provides the ROM with many potential noise sources. This means that there is a high risk of crosstalk between tracks on the same and, in multilevel circuits, on different levels.

SUMMARY OF THE INVENTION

In accordance with a first aspect of the present invention, a semiconductor memory having a memory contents read arrangement comprises at least one bitline connected to each of a column of memory cells and means responsive when the column is selected to connect the bitline to a charging voltage, the bitline being substantially uncharged prior to the column being selected.

In accordance with a second aspect of the present invention, a semiconductor memory having a memory contents sensing arrangement comprises: at least one bitline connected to each of a column of memory cells, a sense amplifier, and means responsive when the column is selected to apply a charging voltage to the bitline and to connect the bitline to an input of the sense amplifier, the bitline being substantially uncharged prior to the column being selected.

In accordance with a third aspect of the present invention, a semiconductor memory comprises: at least two bitlines each associated with a respective column of memory cells, each bitline being connected to each memory cell in its respective column, each bitline selectively connected by an associated mux to a sense amplifier input line common to the bitlines in dependence on a respective column select signal; and a pull up transistor arranged to connect the sense amplifier input line to a charging voltage in dependence on a logic signal. The pull up transistor thereby charges the sense amplifier input line and the selected bitline without charging unselected bitlines. Also, as pull up transistors are associated with the sense amplifier input line rather than the bitlines, fewer pull up transistors are needed.

BRIEF DESCIPTION OF THE DRAWINGS

An embodiment of the present invention will now be described, by way of example only, with reference to the accompanying drawings of which:

DETAILED DESCIPTION OF THE PREFERRED EMBODIMENTS

Figure 3:
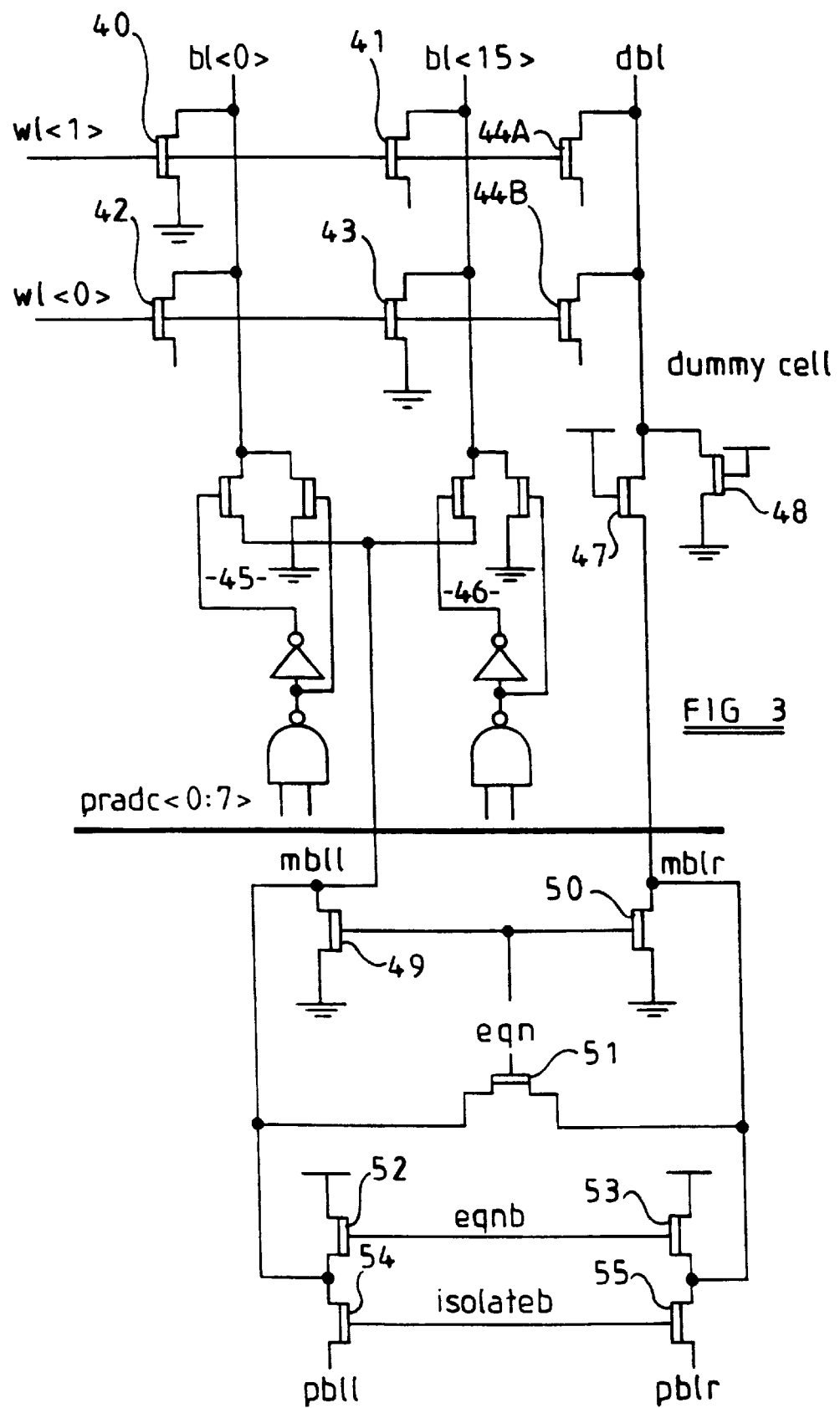
FIG. 3 shows a semiconductor memory in accordance with the present invention, in the form of a read only memory.

In FIG. 3, first to fourth memory cell transistors 40 to 43 are shown each connected to one of wordlines wl<1> and wl<0> and to one of bitlines bl<0> and bl<15>. Dummy transistors 44a and 44b are connected in a similar manner to a dummy bitline dbl. As in the FIG. 1 ROM, these transistors are included in a large array of memory cell transistors. The bitlines bl<0> and bl<15> are selectively connected to a first sense amplifier input line mbll by respective ones of column decode and mux logic circuits 45 and 46, which are arranged to be connected to a predecoded address bus line pradc in much the same way as the FIG. 1 ROM. Dummy transistors 47 and 48 are connected between the dummy bitline dbl and a second sense amplifier input line mblr so as to match the characteristics of the line dbl to those of the bitlines bl<0> and bl<15>. The transistor 48 is permanently connected to supply voltage so as to provide a half read zero drive current onto the line mblr. Grounding transistors 49 and 50 are connected between respective ones of the lines mbll and mblr and ground potential. Their gate electrodes are commonly connected. An equalization transistor 51 is connected between the lines mbll and mblr and has its gate electrode connected to the common gate electrode connection of the grounding transistors 49 and 50. Pull-up transistors 52 and 53 are connected between supply voltage and respective ones of the lines mbll and mblr. Isolation transistors 54 and 55 are connected between respective ones of the lines mbll and mblr and respective ones of third and fourth sense amplifier input lines pbll and pblr.

Figure 4:
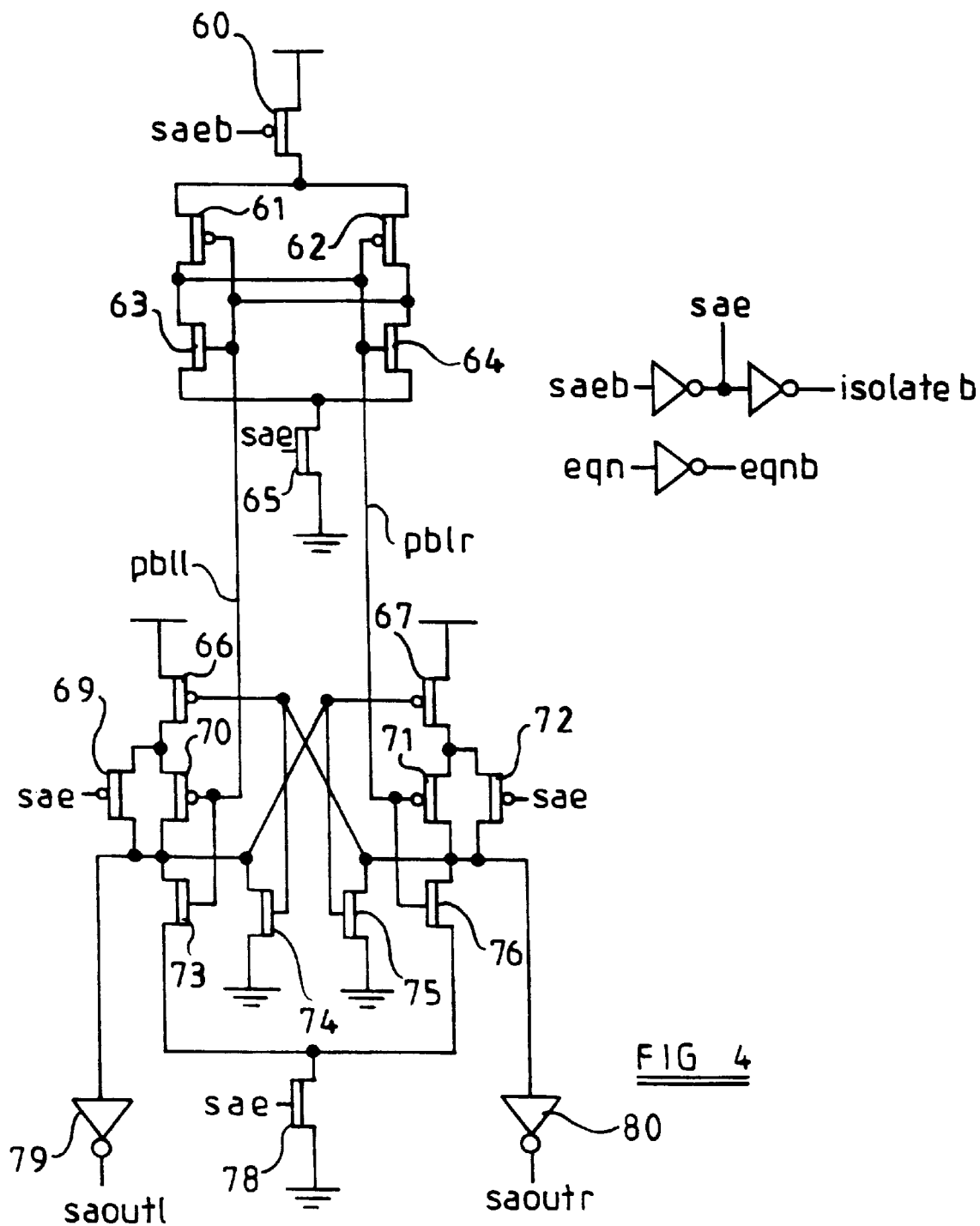
FIG. 4 shows a sense amplifier for use with the FIG. 3 semiconductor memory.

Referring now to FIG. 4, the sense amplifier is formed in two stages, the amplifying stage of which comprises transistors 60 to 65 and the latching stage of which comprises transistors 66 to 78 and inverters 79 and 80.

Figure 5:
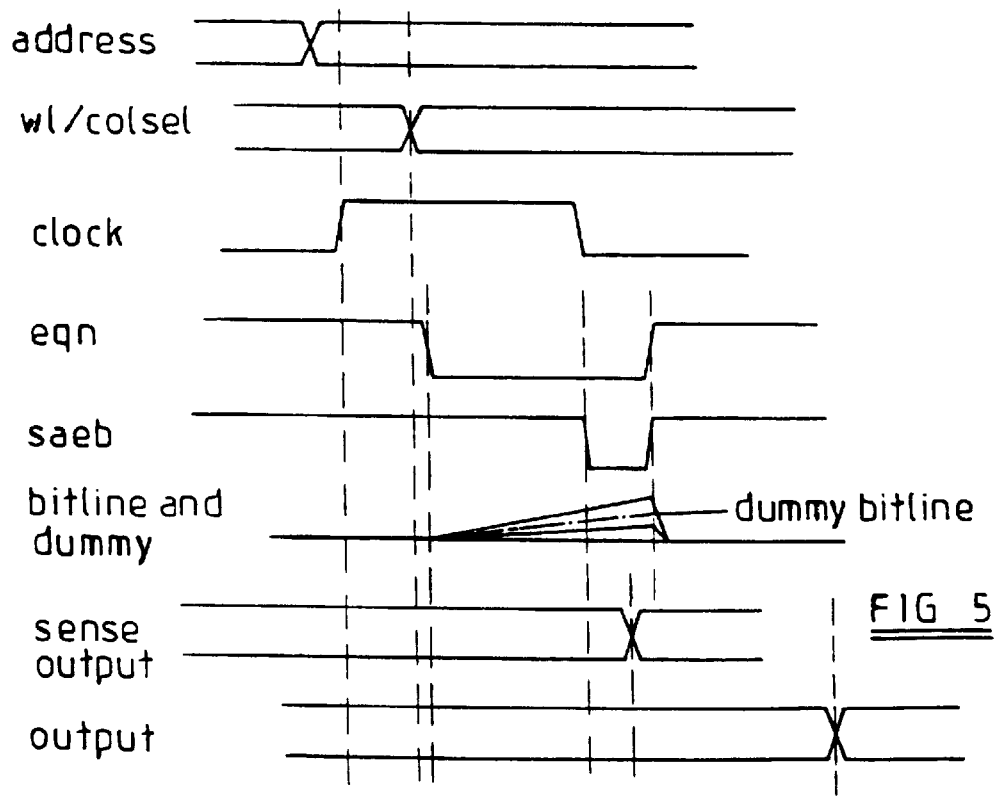
FIG. 5 shows a timing diagram of the FIG. 3 and FIG. 4 semiconductor memory arrangement.

Operation of the semiconductor read only memory of FIG. 3 will now be described with reference to FIGS. 3, 4 and 5.

A read cycle commences with an address signal being applied to address decode logic (not shown). At this time, the column decode and mux logic circuits 45 and 46 are switched off. This causes the bitlines bl<0> and bl<15> to be connected to ground potential, the pull-up transistors 52 and 53 also being switched off. The lines mbll and mblr are held to ground potential by the grounding transistors 49 and 50, and are further equalized by the equalization transistor 51. The lines mbll and mblr are further connected to respective ones of the lines pbll and pblr by virtue of the isolation transistors 54 and 55 being switched on. A time after the rising edge of the clock signal, the address decode logic (not shown) enables one of the wordlines wl<0> and wl<1>, and a selected one of the column decode logic circuits 45 and 46.

A predetermined time after the rising edge of the clock signal, eqn goes low thus switching off the transistors 49 and 50 and the equalization transistor 51, and switches on the pull-up transistors 52 and 53. At this time, the selected bitline bl<0> or bl<15> experiences an increase in voltage, by virtue of the pull-up transistor 52. The dummy bitline dbl experiences also an increase in voltage due to the transistor 48. The rate of change of voltage experienced is dependent only on whether the memory cell transistor 40 to 43 which is connected to the enabled wordline wl<0> or wl<1> is connected to ground potential or not. If this transistor is ground connected, the respective bitline will charge more slowly than the dummy bitline dbl, and vice versa. The lines pbll and pblr will charge with the bitline to which they are connected.

A level detection circuit (not shown) operates to pull down a signal saeb on detection of the voltage on the dummy bitline dbl having reached a predetermined level. This level is set to be a small amount above the nmos transistor threshold voltage, preferably between 1 and 1.3 volts. At this point, the isolation transistors 54 and 55 are switched off, thereby electrically isolating mbll from pbll and mblr from pblr. The fall of saeb also switches on or enables the sense amplifier amplifying stage transistors 60 and 65. This causes the transistors 61 to 64 to amplify the voltage signal present on the lines pbll and pblr. The signal saeb is held low for a predetermined time, which need be sufficient only for the data from the sense amplifier amplifying stage to become set up in the sense amplifier latching stage. Before the signal saeb rises, the sense amplifier output line saoutl propagates the output signal to buffer logic (not shown), thence to a Q output.

Both signals saeb and eqn rise at the same time, which causes the transistors 49 to 51 to become grounded, equalizes the lines mbll and mblr, switches off the pull-up transistors 52 and 53, reconnects the lines mbll and mblr to respective ones of the lines pbll and pblr, and latches the sensing signals from the lines pbll and pblr into the sense amplifier latching stage by virtue of the latching transistors 66, 67, 69, 72, 74 and 75. The sense amplifier amplifying stage is also switched off, because the transistors 60 and 65 are switched off. At this point, equalization is again achieved.

Figure 1:
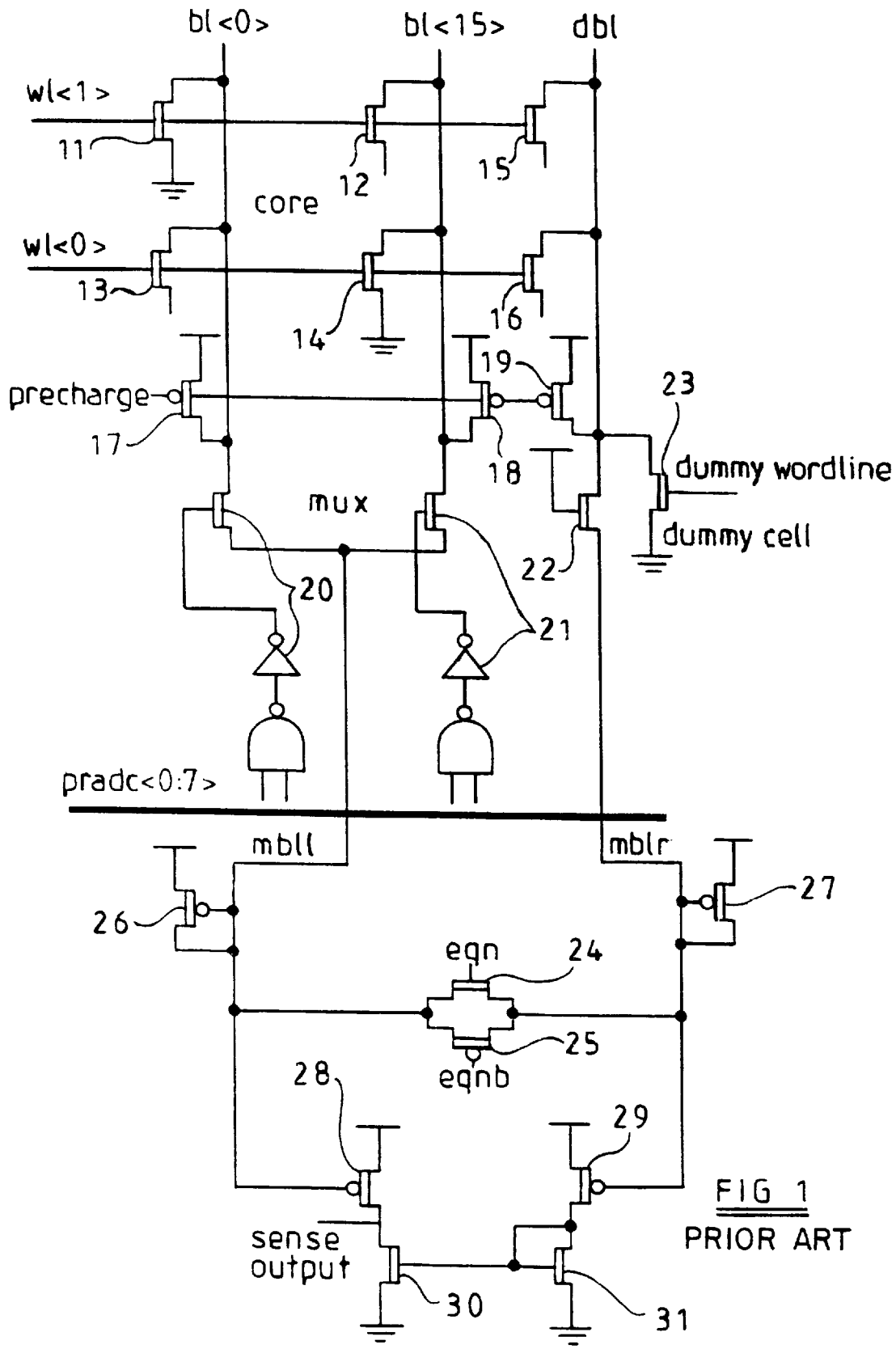
FIG. 1 shows a prior art semiconductor read only memory.
Figure 2:
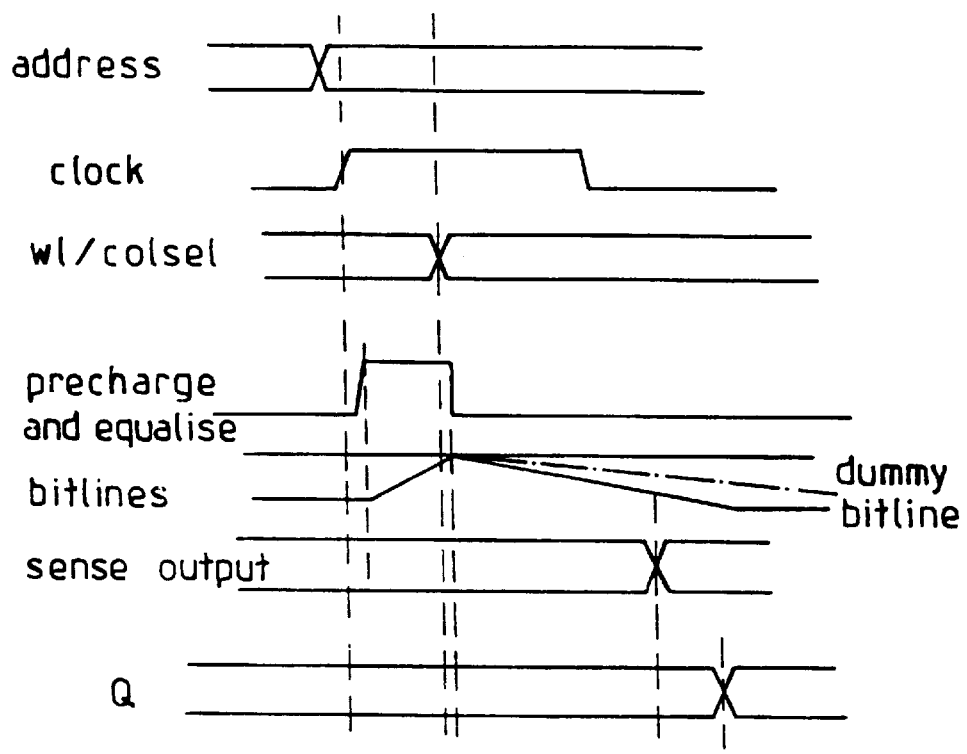
FIG. 2 shows a timing diagram of the FIG. 1 ROM.

Because only selected bitlines are charged and thus discharged, the FIG. 3 semiconductor memory is more power efficient than the FIG. 1 memory. Furthermore, there is less discharge because the bitlines are charged to only a small amount above an nmos transistor threshold voltage, e.g. between 1 and 1.3 volts. Also, as fewer bitlines are discharged, less noise is produced and there is less opportunity for crosstalk between bitlines and other tracks than in the FIG. 1 memory.

To minimize the access time of the FIG. 3 memory, it is desirable to closely match the address decode logic path delay time with the failing edge of the eqn signal. If the address decoder logic cannot be guaranteed to perform its function before the eqn signal falls, or if it is desired to have the eqn signal fall as soon as possible after the rising edge of the clock signal, it is advantageous to detect that the address decode logic has completed before allowing the eqn signal to fall. This is the situation described in the above embodiment. Alternatively, the eqn signal could be arranged to fall a predetermined time after the rising edge of the clock signal. This alternative would provide reduced complexity in the semiconductor memory.

Because the isolation transistors 54 and 55 are switched on when selected bitlines are being charged, the sense amplifier input lines pbll and pblr are charged along with the lines mbll and mblr. The advantages of this are reduced power noise and improved access time. Access time is improved because the sense amplifier is charged simultaneously with, rather than sequentially to, sensing signals being set upon the bitlines.

With the FIG. 3 memory, equalization of the lines mbll and mblr is the usual state. This state is only interrupted when the sense amplifier is required to sense new data from the memory cell transistors 40 to 43. This arrangement thus substantially eliminates prior problems found in having to guarantee sufficient time for equalization before data is read from the memory cell transistors 40 to 43. The extent to which the prior problems are overcome by this arrangement is particularly noticeable at speeds below the maximum operating speed.

What is claimed is:

1. A semiconductor memory, comprising:
   a) at least one column of memory cells;
   b) at least one bitline connected to said at least one column of memory cells;
   c) an addressing circuit for selecting said at least one bitline for a read operation of said at least one column of memory cells;
   d) a controlled discharge path for ensuring that said selected at least one bitline is substantially discharged at a start of said read operation;
   e) a controlled charging path for charging said selected at least one bitline from said start of said read operation;
   f) a sense amplifier for sensing a voltage on said selected at least one bitline during charging of said selected at least one bitline by said controlled charging path;
   g) said at least one bitline comprising a plurality of bitlines; and
   h) a multiplexer responsive to said addressing circuit for selecting one at a time said plurality of bitlines, said multiplexer being operative for grounding each unselected one of said plurality of bitlines.

2. The memory as claimed in claim 1; and further comprising a dummy bitline, a discharge path for discharging said dummy bitline, and a further controlled charging path for charging said dummy bitline from said start of said read operation, said sense amplifier having first and second differential inputs which are connected, during said read operation, to said selected at least one bitline and to said dummy bitline, respectively.

3. The memory as claimed in claim 2, in which said sense amplifier is enabled when a voltage on said dummy bitline reaches a threshold value.

4. The memory as claimed in claim 3, in which said sense amplifier has at least one input transistor and said threshold value is greater than or equal to a threshold voltage of said at least one input transistor.

\* \* \* \* \*